United States Patent [19]

Hwang et al.

[11] Patent Number: 4,734,751
[45] Date of Patent: Mar. 29, 1988

[54] SIGNAL SCALING MESFET OF A SEGMENTED DUAL GATE DESIGN

[75] Inventors: Ying C. Hwang, Liverpool; Young K. Chen, Syracuse, both of N.Y.

[73] Assignee: General Electric Company, Syracuse, N.Y.

[21] Appl. No.: 735,991

[22] Filed: May 20, 1985

[51] Int. Cl.$^4$ ...................... H01L 29/80; H01L 27/04
[52] U.S. Cl. ........................................ 357/22; 357/41; 307/242; 307/243; 330/277; 333/81 R
[58] Field of Search ................ 307/242, 243; 330/277; 357/22, 41; 333/81 R

[56] References Cited

U.S. PATENT DOCUMENTS

| 4,048,646 | 9/1977 | Ogawa et al. | 357/22 H |
| 4,315,272 | 2/1982 | Vorhaus | 357/22 H |
| 4,439,744 | 3/1984 | Kumar et al. | 330/277 |
| 4,511,813 | 4/1985 | Pan | 330/277 |
| 4,598,252 | 7/1986 | Andricos | 330/277 |

Primary Examiner—William D. Larkins
Attorney, Agent, or Firm—Richard V. Lang; Carl W. Baker; Fred Jacob

[57] ABSTRACT

A novel signal scaling MESFET of a segmented dual gate design is disclosed. The MESFET, which is monolithically integrated on a semi-insulating substrate capable of localized surface modification to form active semiconductor regions using MMIC (monolithic microwave integrated circuit) techniques, has a small AC signal transfer which is adjustable in selected discrete steps. For operation in the gigahertz range, the substrate is preferably of gallium arsenide.

In applying the MMIC technique, the MESFET, including segment electrodes and segment interconnections, and the electrical connections, signal paths, and passive components connected to the MESFET are formed on the substrate and defined by a photolithographic process. The technique permits reproducable feature definition and very compact minimum reactance segment interconnections, reducing deleterious parasitics and facilitating virtual unitary MESFET operation to very high frequencies.

The signal scaling MESFET is an active MESFET subdivided into an n-fold plurality of selectively activated MESFET segments, each of a predetermined width, with dual gates for each segment. The AC input signal is applied to the first gates of all n segments and a DC control potential is selectively applied to the second activating gate of each of the n segments to turn current flow "ON" or "OFF" in selected segments. The MESFET transfer values so formed are each substantially constant in a small AC signal sense and successive values are stepped at intervals suitable for linear, trigonometric, logarithmic or arbitrary scaling functions.

2 Claims, 9 Drawing Figures

"ON" STATE

"OFF" STATE

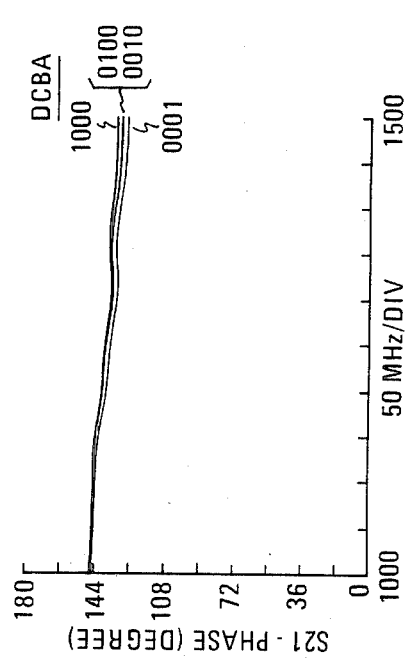
FIG. 4A MAGNITUDE VS. FREQUENCY
FIG. 4B PHASE VS. FREQUENCY
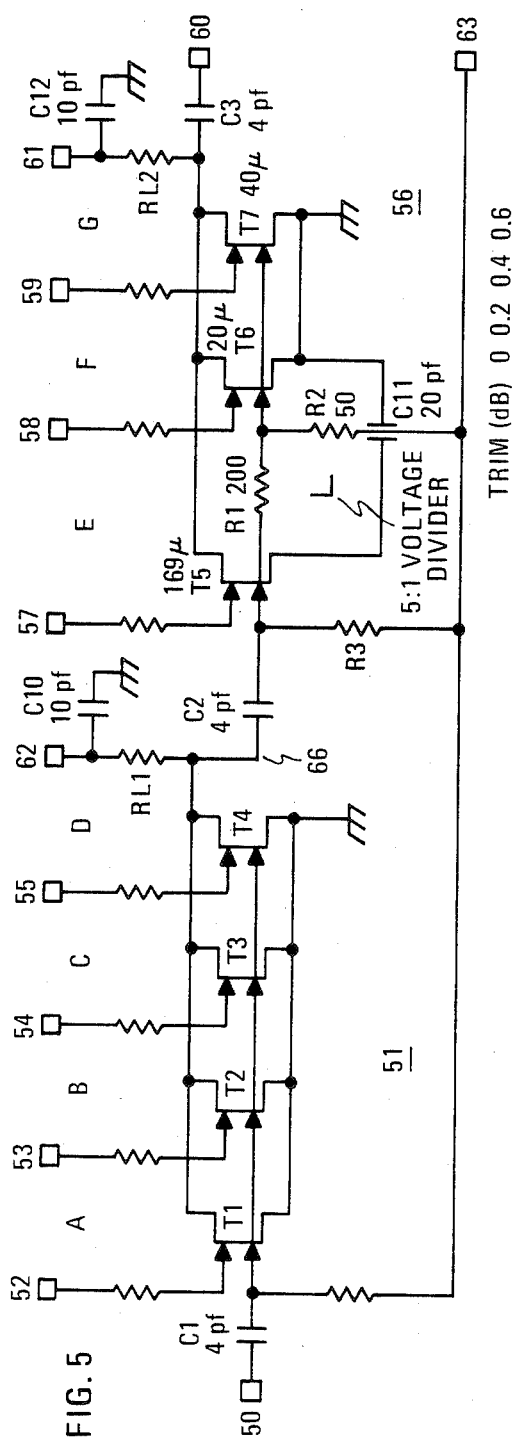
FIG. 5

SIGNAL SCALING MESFET OF A SEGMENTED DUAL GATE DESIGN

The Government has rights in this invention pursuant to Contract No. F19628-80-C0002, awarded by the U.S. Air Force.

CROSS REFERENCE TO RELATED APPLICATION

The present application is related to the copending application of Hwang, Chen and Ragonese entitled A DIGITALLY CONTROLLED WIDEBAND PHASE SHIFTER, Ser. No. 735,990 filed May 20, 1985, now U.S. Pat. No. 4,638,190 assigned to the Assignee of the present invention, and filed concurrently herewith.

BACKGROUND OF THE INVENTION

1. Field of the Invention

The invention relates to stepped signal scaling and more particularly to a metal semiconductor field effect transistor (MESFET) designed for operation at frequencies ranging from a fraction of a gigahertz to many gigahertz, the signal transfer (gain and/or attenuation) being stepped in discrete steps over a given range of transfer values. Signal scaling finds major application to antenna arrays.

2. Description of the Prior Art

Monolithic microwave integrated circuit (MMIC) technology has proven useful in electronic circuitry operating at frequencies in the gigahertz range. The technology relies largely on the definition of the active and passive components and their interconnections by a precise, and repeatable photolithographic technique on a monolithic substrate. A preferred substrate material is gallium arsenide. Application of the technology results in a compact and electrically efficient design. The circuits and devices fabricated from this material function well at these frequencies and are capable of precise engineering characterization.

Typically, signal gain in the transmission or reception of signals involving antenna arrays must be adjusted either row by row or element by element. The adjusting means depending upon the number of rows or elements of the array, must be of such accuracy as to preserve the accuracy inherent in focusing or the steering of the array. The adjusting means should be sufficiently broadband as not to distort the signal, often broadband, which is being processed.

It has been proposed that a dual gate MESFET be used for signal gain control. In this application, the signal is applied to the number 1 gate, the gate closest to the source, and a gain control voltage is applied to the number 2 gate, the gate closest to the drain. The control effected by this means is highly non-linear in the conventional device. In addition, because there are many variables effecting the signal transfer value, this approach has lacked precision and repeatability.

An inherent problem in the referenced design is that when the voltage applied to the control gate is changed, both the gain and the phase of the output signal also change. The complex transfer value is additionally dependent upon the biasing, upon the geometry, and upon process dependent characteristics of the device. The result is that the device is difficult to characterize in practice, and when characterized, difficult to employ without compensation. Thus, it has become desirable to find an approach to signal scaling in which the signal gain or attenuation may be adjusted largely independently of phase, and in which the transfer function is precise and repeatable.

SUMMARY OF THE INVENTION

An object of the invention is to provide an improved signal scaling MESFET in which the small AC signal transfer is adjustable in selected discrete steps.

It is another object of the invention to provide an improved signal scaling MESFET for use at frequencies ranging from tenths of a gigahertz to tens of gigahertz.

It is a further object of the invention to provide a stepwise signal scaling MESFET for use at gigahertz frequencies wherein changes in amplitude may be achieved without a substantial change in phase.

It is an additional object of the invention to provide an accurate signal scaling MESFET for use at gigahertz frequencies applicable to signals of wide bandwidth.

It is still another object of the invention to provide a stepwise adjusted, signal scaling MESFET for use at gigahertz frequencies, which has a substantially constant input impedance at each setting to reduce reflective signal loss due to impedance mismatching.

It is another object of the invention to provide a small AC signal scaling MESFET for use at gigahertz frequencies having improved input/output isolation.

These and other objects are achieved in accordance with the invention in a monolithically integrated MESFET having a small AC signal transfer which is adjustable in discrete steps. The MESFET is an active MESFET, subdivided into an n-fold plurality of selectively activated MESFET segments, each of a predetermined width, with dual gates for each segment.

The MESFET is provided with a single terminal for application of an AC input signal to the first gates of all n segments, a drain terminal for application of drain potentials and derivation of an AC output signal (from all n segments), a source terminal for application of source potentials, and an n-fold plurality of segment activating terminals for selective application of DC control potentials to the second, activating gate of each of the n segments.

The MESFET segments each include an electroded source region, an electroded drain region, and a gate region. The gate region of each segment is provided with a signal gate, connected in common with the signal gates of all the other segments, and disposed between the source and the second, activating gate electrode. The signal gate electrode is designed to modify the output signal current of the MESFET segment as a function of its transconductance, the transconductance being substantially proportional to the width of the segment. The gate region has a second, activating gate electrode individually connected to a segment activating terminal, and disposed between the signal gate and the drain. The activating gate electrode is designed to turn current flow in the individual segment "ON" and "OFF". These conditions correspond respectively to substantial cut-off and substantial saturation of the segment.

The n-fold MESFET segment transconductances are weighted such that when the segments are activated in successive combinations, a desired series of MESFET transfer values is achieved. The MESFET transfer values are each substantially constant in a small AC signal sense and successive values are stepped at intervals depending upon the application. For instance, in the event that it is desired to provide a linearly scaled output, in which the gain is stepped in proportion to a series of consecutive integers, one may use binary scaling in which successive segments are of twice the transconductance of the preceeding segment (i.e. 1, 2, 4, etc. achieved by doubling the width of succeeding segments). In this manner, consecutive transconductances proportional to 0, 1, 2, 3, 4, 5, 6, 7, etc. may be achieved, under the control of a conventional binary coded signal of three bits (or more). The transconductance of successive combinations may also be scaled for logarithmically or arbitrarily stepped values.

In accordance with a further aspect of the invention, vernier or trimming steps may be achieved, either to extend the range or to increase the resolution, by using a voltage divider for applying the signal to the segments representing the smaller steps. This allows the width of the smaller width segment to be increased in proportion to the division ratio while not increasing the equivalent transconductance, a practice which restores the signal transfer to the desired value, while avoiding the disadvantages of unduly narrow gates.

The segmented dual MESFET is fabricated ussing monolithic microwave integrated circuit (MMIC) techniques on a semi-insulating substrate having locally active semiconductor regions. A preferred substrate material is gallium arsenide. The MESFET (including segment electrodes and segment interconnections), and the electrical connections and signal paths to the MESFET, the essential passive components connected to the MESFET for signal coupling and filtering are formed on the substrate and defined by a photolithographic process.

The technique permits very compact minimum reactance segment interconnections reducing deleterious parasitics, facilitating virtual unitary MESFET operation to very high frequencies, and broadband scaling.

BRIEF DESCRIPTION OF THE DRAWINGS

The novel and distinctive features of the invention are set forth in the claims. The invention itself, however, together with further objects and advantages thereof may best be understood by reference to the following description and accompanying drawings in which:

FIG. 1A is a plan view of the MESFET at an intermediate stage in the assembly illustrating the electrodes of individual segments of the MESFET and the pads at the perimeter of the semiconductor substrate; and FIG. 1B is a plan view of the MESFET of FIG. 1A at a later stage in the assembly, after connections between electrodes and pads are complete;

FIGS. 4A and 4B are graphs illustrating the performance of the embodiment illustrated in FIGS. 1A and 1B;

FIG. 4A illustrates the constancy of the output signal magnitude with frequency and the constancy of the scaling ratios; and FIG. 4B illustrates the constancy of phase with frequency and more particularly the independance of the phase, at a given frequency, with respect to scaling ratios;

FIG. 5 is a circuit diagram of an attenuator suitable for use from UHF to X-band wherein a second segmented dual gate MESFET is provided in series with a first device for providing additional vernier steps to supplement the coarser steps provided by the initial device.

DESCRIPTION OF THE PREFERRED EMBODIMENT

Figure 1A:
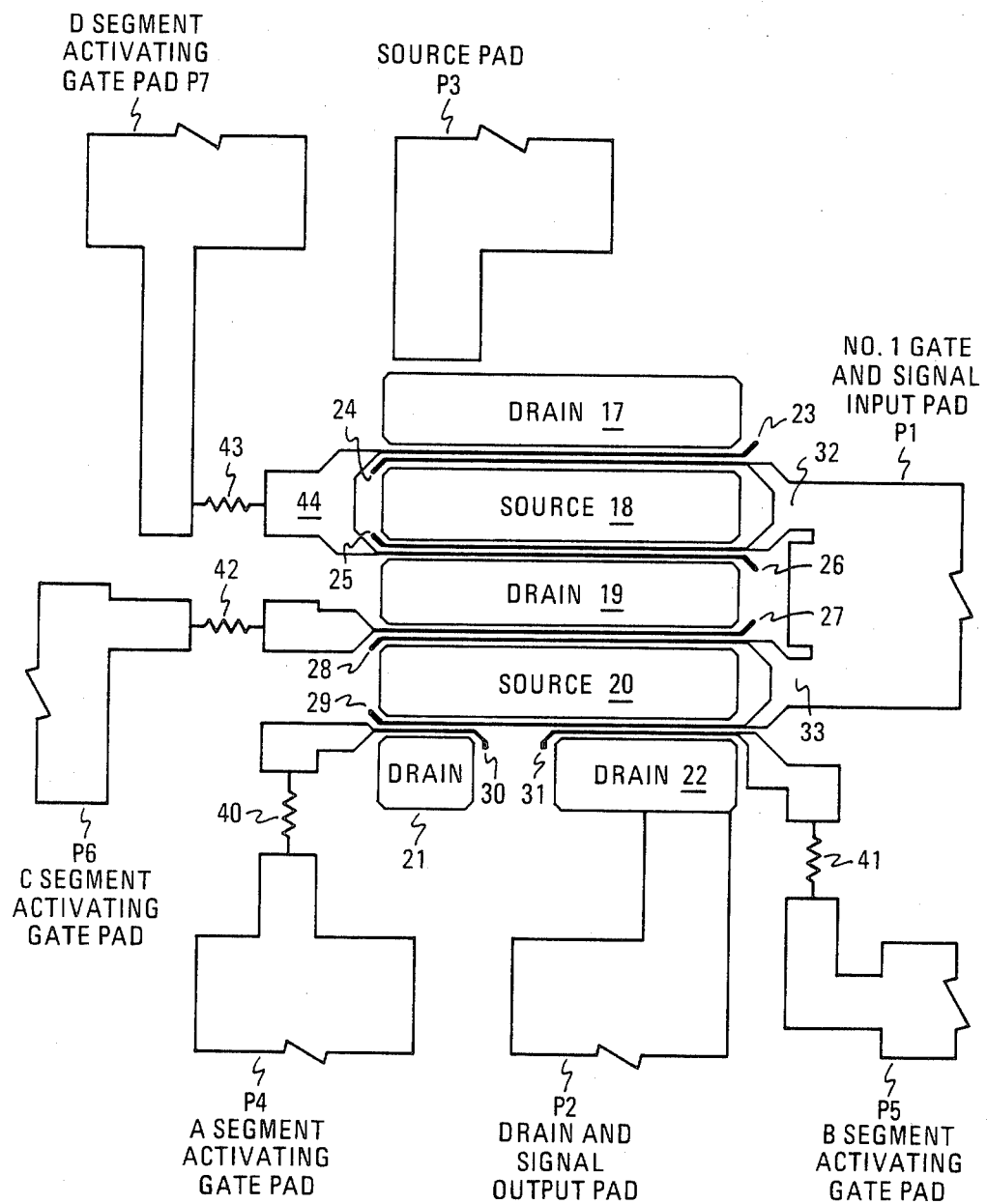
FIGS. 1A and 1B are plan views of a novel monolithically integrated segmented dual gate MESFET designed for accurate signal scaling.
Figure 1B:
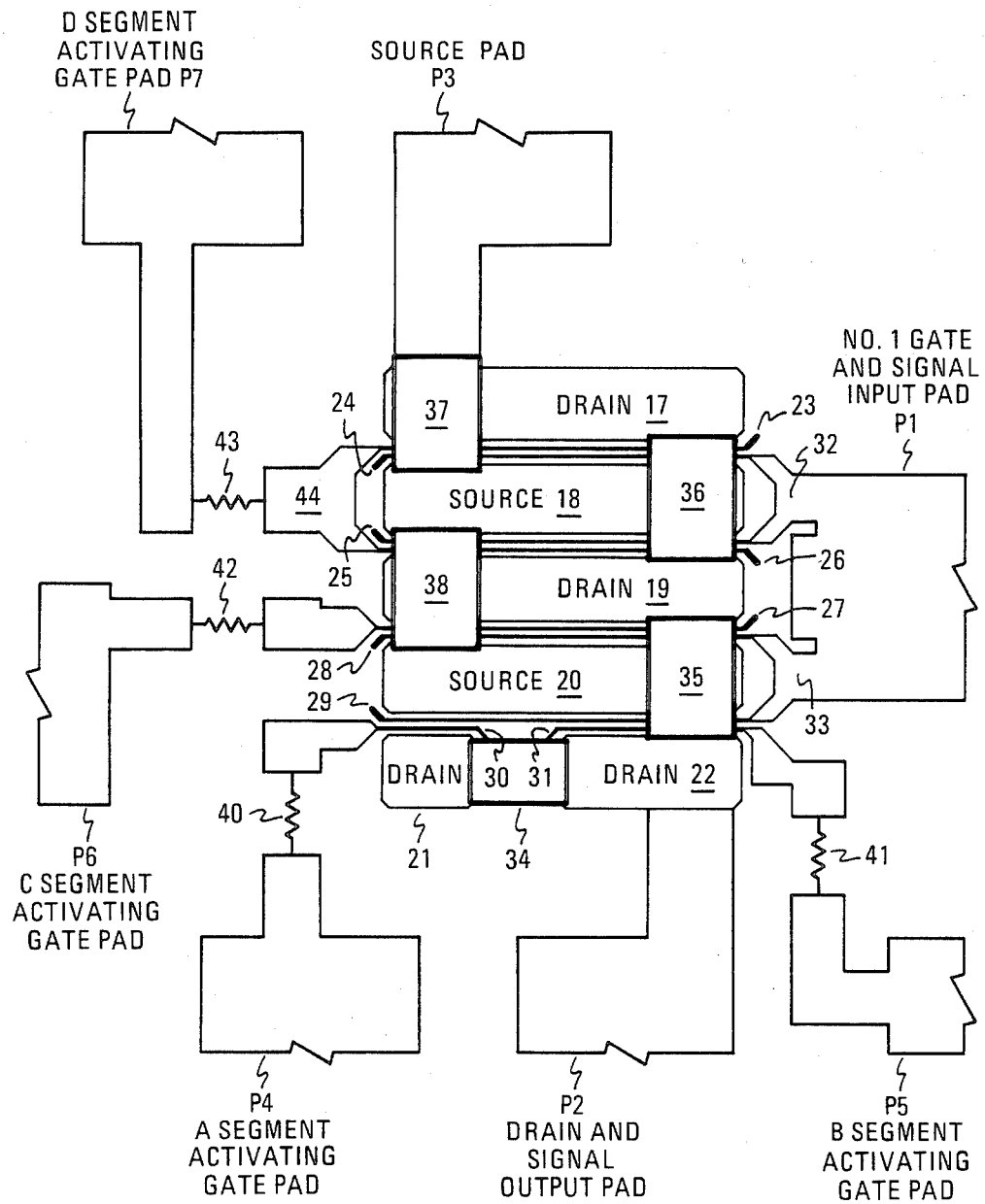
Figure 2:
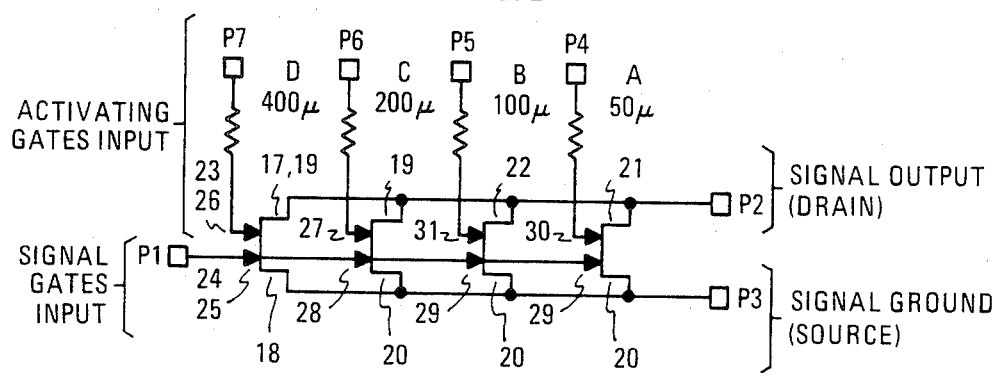
FIG. 2 is a circuit diagram of the MESFET illustrated in FIG. 1.

A novel monolithically integrated signal scaling MESFET embodying the invention is shown in FIGS. 1A, 1B and 2. The MESFET is of a segmented dual gate design having a first gate (G1) for signal input and a second gate (G2) for activation of each segment into which the total MESFET is divided. The individual segments, which are fully functional active MESFET devices, have the widths noted in the circuit diagram of FIG. 2. The metallizations of the individual source, drain and gate segments of the MESFET and of the pads for external connection are as shown in FIG. 1A. Afterwards, air bridges and serial resistances are added, as shown in FIG. 1B, to complete the connections between segments and between segments and the external pads.

The signal scaling MESFET provides an accurately stepped voltage transfer function to an applied small AC signal over broad microwave bandwidths. The stepped transfer function, which consists of a series of constant transfer values, is achieved by dividing the MESFET into a plurality of individual segments and by activating or inactivating individual segments to achieve a desired active gate width. In the first embodiment, the control is achieved in sixteen steps by selective activation of four individual segments (A, B, C, D) having respective gate widths of 50, 100, 200, and 400 microns. Selective activation of the segments allows the MESFET to exhibit sixteen active gate widths from 0 to 750 microns in 50 micron increments. The equivalent transconductances, which may be obtained approximately by multiplying the active gate widths by a constant, is thus also available in sixteen steps.

The signal scaling MESFET, since it is an active MESFET device, may be designed to provide a signal transfer of moderate gain or attenuation. Larger devices provide higher gain and better accuracy, but do so at the cost of larger substrate areas and greater DC power consumption. In typical designs, the signal transfer value (gain) is one, or a few decibels below one, at the highest transconductance setting.

The metallizations and a principal portion of the substrate of the MESFET are shown in FIGS. 1A and 1B. For high frequency operation (up to at least 10 gHz), the substrate is preferably of gallium arsenide, a semi-insulating material capable of being modified to form semiconducting regions suitable for transistor formation. The two most prevalent methods of transistor formation are direct ion implantation or the provision of an expitaxial layer which is semiconducting and which is etched away to form localized mesas suitable for semiconductor activity. The MESFET is formed on a square GaAs substrate approximately 800 microns by 800 microns, with pads P1-P7 for external connection being provided around the periphery of the substrate. The semiconducting region of the substrate is generally rectangular in shape, being approximately 200 by 260 microns, and may be identified by five relatively broad, mutually parallel rectangular metallizations 17, 18, 19, 20, and 21-22 (the lowermost metallizations having two parts). The remainder of the substrate (beyond the 200 by 260 micron region) is semi-insulating permitting conductor runs, transmission lines, capacitors and resistors to be formed on the substrate without significant loss. The MESFET and the circuitry leading to and including the pads at the perimeter of the substrate are formed on the substrate and defined by a lithographic process.

The metallizations 17-31, which are parts of the source, drain and gate electrodes of the FET, are arranged in an interdigitated design. The three broad metalizations 17, 19 and 21-22, at the top, middle and bottom respectively of the electrode set, are part of the drain electrodes for all of the individual segments. The remaining broad metallizations 18 and 20 are a part of the source electrodes for all of the individual segments. The very narrow line-like metallizations which run in parallel between adjoining source and drain metallizations [e.g. (17-18); (18-19); etc.] and which occur in pairs, are the first and second gate electrodes shown in the circuit diagram of FIG. 2. Numbered in pairs from top to bottom, the gate metallizations are (23,24), (25,26), (27,28) and in the bottom most set (29, (30, 31)) where 29 is the continuous upper gate metallization and 30 is the lower gate metallization to the left and 31 for the lower gate metallization to the right.

The pads P1 to P7 are connected to the metallizations 17 to 31 as follows. The pad P1 is the signal input pad. As seen in FIG. 2, the signal input pad is connected to the input signal gate of all four segments of the segmented MESFET. The input signal gate (per FIG. 2) is the gate nearest the source and for that reason may be referred to as the number 1 gate. The pad P1 is provided with two Y-shaped metallizations 32 and 33 respectively at the left edge. The bases of the Y-shaped metallizations 32, 33 abut the pad P1 and the branched ends lead to the full length line-like input signal gate metallizations 24, 25, 28, 29. More particularly, the upper branch of the upper Y metallization 32 is connected to the input signal gate metallization 24 and the lower branch of 32 is connected to the input signal gate metallization 25. The upper branch of the lower Y metallization 33 is connected to the input signal gate metallization 28 and the lower branch is connected to the input signal gate metallization 29.

The pad P2 (per FIG. 2) is the signal output connection for the drains of all four segments of the segmented MESFET. As best seen in FIG. 1B, the drain pad P2 leads upwards toward a connection to the lowermost right drain metallization 22. An air bridge 34 connects the drain metallization 22 to the other lowermost drain metallization 21. An air bridge 35, connects the centrally disposed drain metallization 19 via 22 to the drain pad P2. Finally, an air bridge 36 connects the uppermost drain metallization 17 via 19, via 22 to the drain pad P2.

The pad P3 is the source pad and makes connection (per FIG. 2) to the sources of all four segments of the segmented MESFET. As best seen in FIG. 1B, the source pad P3 leads downwards toward an air bridge 37 spanning the uppermost metallization 17 (a drain) and making contact to the upper source metallization 18. A second air bridge 38 leading downward from metallization 18 spans the metallization 19 and makes contact with the lower source metallization 20, completing the path between pad P3 and metallization 20.

The remaining pads P4, P5, P6, P7 provide independent connections to the line-like metallizations (23, 26, 27, 31, 30) of the activating gates of each MESFET segment via individual 2000 ohm resistors. (The activating gate is furthest from the source and may be referred to as the number two gate.) The activating gates provide a visual means of identifying on FIGS. 1A and 1B the individual A, B, C, and D segments of the MESFET.

As shown in FIG. 1A, the pad P4, which is associated with the A segment, leads upwardly via a 2000 ohm resistance 40, which has short pads at either end. The short line-like activating gate metallization 30 which extends to the right from the upper resistance pad has a "width" of approximately one-quarter the length of the source and drain metallization (17-20) and is of the least width. Activating gate 30 is coextensive in width with and defines the 50 micron wide A segment of the MESFET.

The pad P5 in the lower right corner of FIG. 1A is associated with the B segment and is connected via a 2000 ohm resistance 41, which has pads at either end, to the line-like activating gate metallization 31. The gate metallization 31 which extends to the left from the upper resistance pad has a "width" of approximately one-half the length of the source and drain metallizations (17-20). Activating gate 31 is coextensive in width with and defines the 100 micron wide B segment of the MESFET.

The pad P6 at the left center of FIG. 1A is associated with the C segment and is connected via a 2000 ohm resistance 42, which has pads at either end, to the line-like activating gate metalization 27. The gate metallization 27, which is disposed to the right of the rightmost resistance pad, is approximately the length of the principal source and drain metallizations (17-20). Activating gate 27 is coextensive in width with and defines the 200 micron wide C segment of the MESFET.

The pad P7 in the upper left corner of FIG. 1A is associated with the D segment and is connected via a 2000 ohm resistance 43 and via a U-shaped metallization 44 to the two part line-like activating gate metallizations 23, 26. In particular, the "base" of the U-shaped metallization 44, abuts the right pad of the resistance 43. The upper branch of the "U" is connected to the gate metallization 23 and the lower branch of the "U" is connected to the gate metallization 26. The two metallizations 23 and 26 each extend for the length of the principal source and drain metallizations and by virtue of being connected together have a combined width of 400 microns. They define the width of the D segment of the MESFET as being 400 microns and equal to twice the length of the source and drain metallizations (17-20).

The individual segments (A, B, C, and D) are fully electroded, fully functional MESFET devices which may be activated selectively to determine the transfer value (scaling factor) applied to the input signal as it progresses to the signal output terminal (drain) of the MESFET. The transfer value is attributable to the transconductance of the MESFET, which is the parameter controlling the scaling of the signal, and which is in turn controlled by the width of individual segments.

Figure 3A:
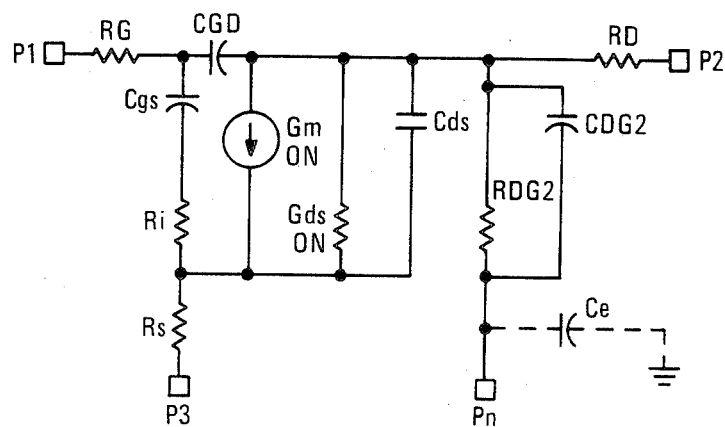
FIGS. 3A and 3B are simplified equivalent circuit models of a segment of the signal scaling MESFET illustrated in FIGS. 1A and 1B corresponding to operation in the "ON" and "OFF" states, respectively.
Figure 3B:
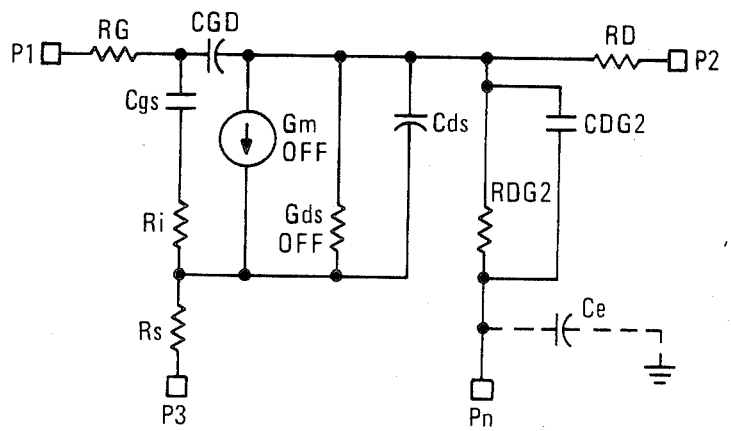

FIGS. 3A and 3B are simplified equivalent circuit models of a dual gate MESFET segment; FIG. 3A representing the "ON" state and FIG. 3B the "OFF" state. The equivalent circuit model is applicable to the transmission of small AC signals in the operating frequency range and is applicable to the segments individually and in combinations.

The MESFET segment is represented in both FIGS. 3A and 3B as a device with four external terminals (not including ground). The pad P1 is the ungrounded signal input terminal leading to the first gate of the segment. The pad P2 is the signal output terminal leading from the segment drain. The pad P3 is the terminal for connection to the segment source and the pad Pn is the terminal to the activating gate of the (nth) segment combination. The equivalent circuit representations are applicable over two or three decades of frequency (i.e. from hundreds of megahertz to tens or perhaps hundreds of gHz). The diagram includes a substantial number of parasitic resistances and capacitances whose value remains substantially the same in the "ON" and "OFF" states of the segment; and a transconductance (Gm) and a drain-source conductance (Gds) which vary between the "ON" and "OFF" states.

More particularly, the equivalent circuit of the MESFET segment combination in FIGS. 3A, 3B includes a gate resistance Rg, a gate to drain capacitance Cgd and a drain resistance Rd in the series path between pads P1 and P2. A first shunt path interconnected between the Rg-Cgd terminal and source pad P3 comprises the gate to source capacitance Cgs, an intrinsic resistance Ri and source resistance Rs. The active region of the MESFET segment is further represented in FIG. 3A by three elements including the transconductance Gm "ON", the drain to source conductance Gds "ON" and the drain to source capacitance Cds, each mutually connected in shunt between the Cgd-Rd terminal and the Ri-Rs terminal. The active region of the MESFET segment is further depicted in FIGS. 3A and 3B by the notations "ON" and "OFF" applicable to the transconductance, (Gm) and to the drain to source conductance (Gds), which are different for the "ON" and "OFF" states. The second gate region is depicted as the drain to G2 resistance Rdg2 shunted by the drain to G2 capacitance Cdg2, the combination being connected between the Cgd-Rd terminal and the activating pad Pn (n denoting the nth segment combination). An external capacitance Ce, which appears at the pad Pn, is useful to explaining device operation.

The equivalent circuit representations of FIGS. 3A and 3B are designed to illustrate the MESFET segment in the "ON" state wherein the device is operated between saturation and "pinch-off". The MESFET devices may be operated in principle in either the depletion mode or enhancement mode, but those herein illustrated are designed for depletion mode operation.

The model and in particular the Gm prediction can be scaled with substantial accuracy with gate width provided that the geometry, terminal voltage and external impedances remain the same. The MESFET is operated with practical loads and accordingly a given Gm will produce a signal transfer (gain or attenuation) in that load which reflects the Gm, but which may not be exactly proportional to Gm as the Gm is scaled. If exact signal scaling ratios are desired, then the Gm values must be tailored to fit the practical application. The tailoring may be regarded as being attributable to the loading effect from parallelled devices exhibiting finite output impedances, the back-gating effect from the non-ideal nature of the substrate, and fringing fields at the smaller gate widths. The scaling may approach the ideal by using good material, good design rules and accurate simulating software. The scaling, when under binary digital control, is readily applied with 4, 5, or 6 bit accuracy. Certain procedures such as the one illustrated in FIGS. 5 and 6 may be used to extend the range up to 10 bit accuracy.

The performance of the segmented dual gate MESFET so far described is illustrated in FIGS. 4A and 4B. FIG. 4A illustrates the magnitude of the output signal under test conditions over the band of 1,000 to 1,500 megahertz at each of the five settings of the activating control (0000,0001, 0010, 0100, and 1000). The illustrated magnitudes are constant and in constant relative proportions (i.e. scaling) to one part in a hundred. FIG. 4B illustrates the phase versus frequency performance of the first embodiment. In particular, the phase is examined over the frequency range of 1,000 to 1,500 megahertz at each of the active settings of the scaler. It may be seen that the phase, which is at approximately 144.2° at 1,000 megahertz is substantially the same (within 1%) at each setting of the activating gates within the illustrated frequency ranges and drifts less than 10% (16°) over the illustrated frequency range.

The embodiment illustrated in FIGS. 1A and 1B provides a step wise linear count of relative transconductance values in integers from zero to seven. One may also implement non-linear steps such as that required for trigonometric functions. A particularly simple approximation of trigonometric scaling may be provided by a three segment gate controlled by a four bit signal. The gate width ratios of the three channels are one to four to eight which by suitable combinations achieves a divide by 13 scheme (i.e. 0/13, 5/13, 9/13, 12/13, 13/13) to provide sine or cosine values at 22.5° intervals between 0° and 90°. For 11¼° intervals between 0° to 90°, a divide by 50 approximation controlled by a 5-bit signal may be employed in which the successive effective segment widths have the values of 0/50, 10/50, 19/50, 29/50, 35/50, 41/50, 46/50, 49/50 and 50/50. In both examples, the error of the approximation is never greater than 2%. The same two approximations may be computer optimized. If the weights of the three segment MESFET for the 22½° intervals are in the proportions of 1:3.613:7.524, an error of less than ½% is to be expected. If the weights of the five segment MESFET for 11¼° intervals are in the proportions of 1:1.45535:2.14035:5.25838:10.95002 then an error of less than 0.8% is to be expected. The application of the scaler and the choice of scaling weights for phase shifting is the subject of the above cited patent application to Messrs Hwang and Chen.

Figure 6:
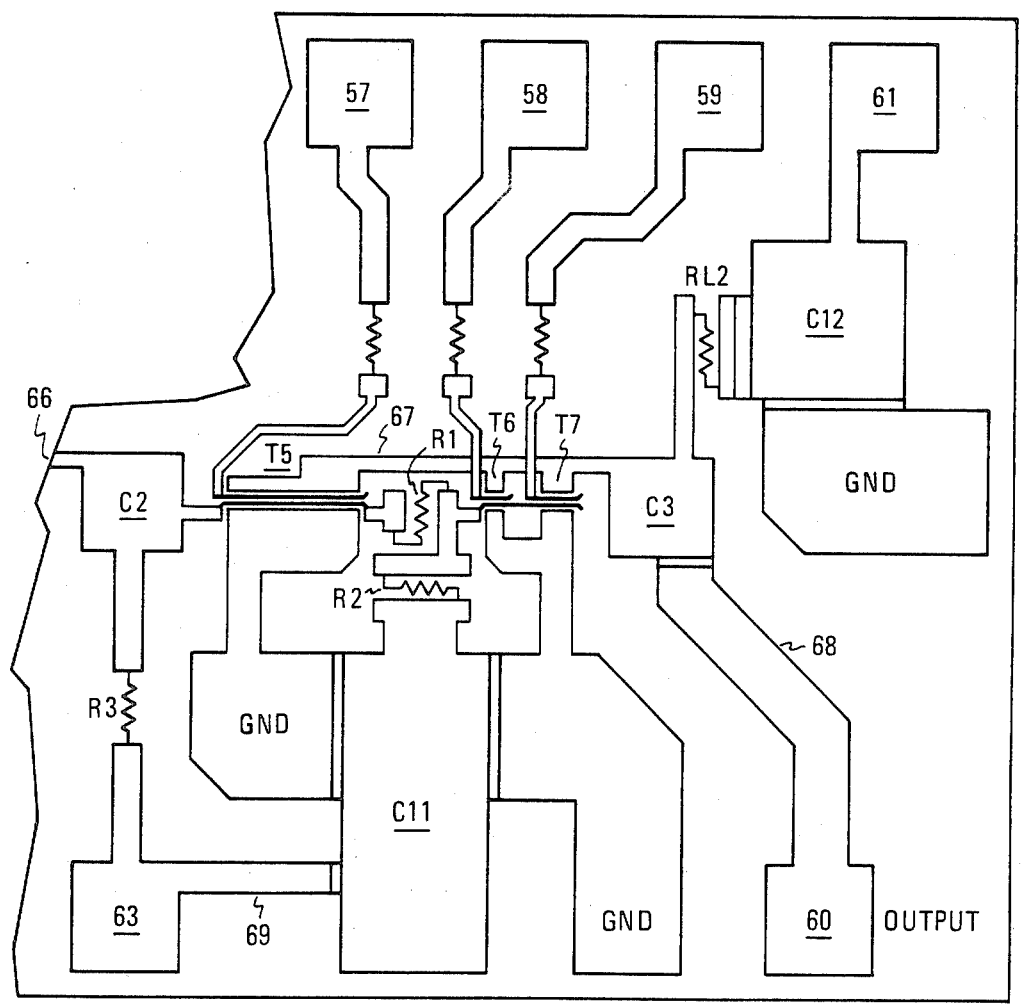
FIG. 6 is a plan view of the MESFET illustrated in FIG. 5, at an intermediate stage in the assembly at which electrodes and pads are in place, but before bridges have been added.

An attenuator having logarithmic scaling suitable for use from UHF to X-band is illustrated in FIGS. 5 and 6. The attenuation varies from zero to greater than 10 db under digital control utilizing 6 coarse (greater than 1 db) settings and four fine (0.2 db) settings. The coarse settings are produced by a first relatively large, four segment MESFET 51 while the fine settings are produced by a three segment MESFET 56 having a first segment width of 169 microns followed by a voltage divider coupling the signal to two smaller segments of 20 and 40 microns width respectivly. The circuit associated with the three segment device 56, illustrates the provision of high resolution attenuation steps.

FIG. 5 in particular provides an electrical circuit diagram of both the coarse and trimmer sections of the attenuator. The drawing indicates the circuit values and the gate widths utilized in the trimmer section. FIG. 6 illustrates the layout of the trimmer section.

As shown in FIG. 5, the input signal to the attenuator is coupled to the signal input pad 50 which is coupled via a 4 picofarad capacitor to the number 1 signal input gates of the segments T1, T2, T3, T4 of the first MESFET 51. The signal input gates are returned via a 2000 ohm resistance to the pad 63 connected to the negative gate supply voltage. The sources of the MESFET segments T1, T2, T3, T4 are connected to substrate ground and the number 2 activating gates are connected through 2K resistances to activating control terminals 52, 53, 54, 55 respectively. The drains of the segments T1, T2, T3 and T4 are connected together and lead via a first load resistance RL1 of 50 ohms to a positive drain source terminal 62, which is bypassed by a 10 picofarad capacity C10, to ground.

The signal from the drain of the MESFET 51 (continuing to trace the circuit diagram of FIG. 5) is then coupled via a 4 picofarad capacitor C2 to the signal gate, common to the three segments of the MESFET 56 in the vernier section of the attenuator. The capacitor-terminal connected to the T5 signal gate, is connected via a 200 ohm resistance to the number 1 signal gates of the T6 and T7 segments and via a 2000 ohm resistance to the pad 63 connected to the negative source supply voltage. A second resistance of 50 ohms connects the signal gates of T6-T7 to the negative source, and forms a voltage division (having a ratio of 5 to 1) of the signal coupled to the attenuator segments T6-T7. The sources of the segments T5, T6, and T7 are connected together and to substrate ground. The three number 2 activating gates of T5, T6, T7 are connected to activating control terminals 57, 58, 59 respectively. The drains of the three segments T5, T6, T7 are connected via a 50 ohm load resistance RL2 to the B+ supply terminal 61 which is bypassed to ground with a 10 picofarad capacitor C12. The signal output appears at the common drain connection of T5, T6, T7 and is coupled via a four picofarad capacitor C3 to the signal output terminal 60.

The logarithmic attenuator of FIG. 5 was fabricated using monolithic microwave circuit fabrication techniques on a gallium arsenide substrate having overall dimensions of approximately 1400 microns by 1600 microns. The MESFETS of the FIG. 5, 6 embodiment have a linear non-interdigitated layout. In the trimmer section, the set of segments T5, T6, and T7 of MESFET 56 are in line, and have the same azimuthal orientation. In the "in line" design, the source, number 1 gate, number 2 gate and drain metallizations occur in the same order along the same coordinate (i.e. from top of the drawing to the bottom).

In the orientations of FIG. 6, the three MESFET segments T5, T6, and T7 of the trimmer section of the attenuator are shown in the center of the substrate with pads for external connection being shown along the top edge, right edge and bottom edge of the illustrated portion of the substrate. Each of the segments is oriented with the drain being uppermost, the number 2 activating gate being next below, the number 1 signal gate being below that, and the drains being lowermost. Each segment of the MESFET 56 is formed on a localized semiconducting region formed on the semi-insulating gallium arsenide substrate. The surrounding semi-insulating region supports inter-segmental connections, DC and signal connections to the MESFET, and passive components such as the signal coupling capacitors (C2, C3 and voltage divider (R1 R2); and filtering and power supply components (RL1, C12). Each feature is formed on the gallium arsenide substrate and defined by a photolithographic process.

The path of the signal proceeds generally from left to right in the FIG. 6 illustration being introduced at the left edge of the substrate via the metallization 66 which leads to the capacitor C2. The capacitor C2 is then connected via a short metallization to the number one signal gate of T5 and then via the voltage divider R1, R2 to the number one signal gates of segments T6 and T7. The attenuator output signal is derived from a metallization 67 coupled to the drains of T5, T6 and T7, which is coupled upward via a filter network consisting of load resistance RL2 and bypass capacitor C12 to the pad 61 for application to a source of positive drain potentials. The signal from metallization 67 is coupled via the capacitor C3 via a downward extending metallization 68 to the signal output pad 60. The sources of the devices T5, T6, and T7 are illustrated connected together to substrate ground. The number 1 signal gates of MESFET T5, are coupled via the resistance R3 to the pad 63 at the lower left corner of the substrate. The segment activating gates are each coupled via a 2000 ohm resistance to the pads 57, 58 and 59 at the top edge of the substrate.

The "in line" design has a process advantage with devices of smaller geometries. For instance, an error in mask positioning, which offsets all of the gates along a coordinate perpendicular to the gate, will produce the same effect on all MESFET segments. In the interdigitated structure, assuming that the order of the source and drain are interchanged in half of the segments, the same mask displacement will place one set of gates closer to the source and the alternate set of gates closer to the drain. The result is that alternate devices will have differing operating characteristics. This problem is most severe at the higher resolutions, but at lower resolutions is only one of many factors which must be taken into account when establishing a satisfactory MMIC layout.

The present invention provides a method of scaling the gain of a MESFET by partitioning the MESFET into segments of differing width dimensions, and selectively activating different combinations of segments. The scaling therefor becomes proportional to the transconductances of the activated segments, which in turn are dependent on the respective widths of the segments. Since the segments are operated in an "ON/OFF" mode (i.e. "activated"), the scaling retains its accuracy irrespective of changes in bias, in temperature and in many process variations. These changes, which affect each segment proportionately, do not—to a first order at least—affect the scaling which the dual gate segmented MESFET produces.

The scaling range or the finess of the resolution may be increased by the use of the voltage divider illustrated in the FIGS. 5, 6 embodiment. Without the use of the 5 to 1 step down voltage divider, the gates subject to the step down ratio would have had to be one-fifth the gate width finally employed. Because of fringing effects and inaccuracies, gate width scaling down to gate widths of a few microns (normally less than 10 microns) is often impractical. With the voltage divider having a division ratio of 5 to 1, the gate widths may be multiplied by a factor of approximately 5, which increases the transconductance by a factor of five to achieve approximately the same overall gain. Thus with the use of a supplemental voltage divider, the voltage scaling can assume a wider scaling range or finer resolution when fixed input and output impedances are assumed.

As earlier noted, with binary segment scaling, 4, 5, and 6 bit signal scaling is quite practical, while with the use of the voltage division technique, the scaling may be extended several more bits, depending on application.

The vernier principle may be applied within a MESFET to apply to the finer segments or it may be applied between two MESFETS, one designed for coarse steps and the other designed for the finer steps.

The signal transfer of the segmented dual gate MESFET may provide either a stepped attenuation, a stepped gain, or stepped signal scaling in which the range incompasses both attenuation and gain. At a signal at a given frequency within the range of application of the invention, whether narrow band or broad band, a change in signal amplitude is not accompanied by a substantial change in phase.

In principle, the scaling property is dependent upon scaling the transconductance of the individual segments, which is achieved by adjusting the widths of the individual segments. The signal gain may be calculated as a function of the input signal voltage, the transconductance which produces a corresponding output signal current, and a load resistance in which the output signal current flows and produces an output signal voltage. In practical applications, exact gate width dimensions are obtained by taking into account those parameters significantly impacting the signal transfer calculation.

The use of a dual gate design for the individual MESFET segments has two further advantages in most practical applications. The presence of the second, activating gate acts as a shield between the signal input gate and the signal output drain and greatly enhances the input-output isolation. The isolation gives greater accuracy in scaling by reducing the feedthrough capacity. In addition, the dual gate design tends to retain a substantially constant input impedance due to the fixed nature of the parasitics in the equivalent circuit at the first gate which change very little between the active and inactive states. Thus the segmental dual gate MESFET devices, when inserted in a circuit, may be designed to match the characteristic impedances of the connecting transmission lines (e.g. 50 ohms), and will preserve the match throughout the range of settings of the attenuator. Thus signal losses due to reflections of the attenuator will remain quite low.

The segmented dual gate MESFET herein described is a broad band device often operable over an octave of the frequency spectrum in practical realizations. In principle, there is no lower frequency limit. However, in practice the VHF frequencies may represent the lower limit at which the design has practical advantages over competing techniques. The upper frequency limit is established by the gain and parasitics of a given device viewed as an amplifier. A current upper limit using gallium arsenide devices with 1 micron gates is approximately 10 gigahertz. The bandwidth of the device is ordinarily measured in terms of the tolerable change in relative phase at different settings of the scaler. Accordingly, assuming a system application in which a 5 degree error in relative phase is tolerable, a bandwidth of 10% can be achieved at 5 gigahertz. Since the phase error increases at the upper limits of operation and decreases at the lower limits, a full octave of operation below these frequencies is ordinarily available without a significant increase in the phase error.

As previously stated, the scaler herein described makes use of the extraordinary characteristics of a method of circuit fabrication currently known as "MMIC" (monolithic microwave integrated circuit) technology. In current usage, the term "MMIC" implies a circuit fabrication technique in which active and passive components are formed by a photolithographic process on an insulating substrate having both electrically active regions, in which transistors may be formed, and electrically passive regions, in which conductive runs, transmission lines, inductors, capacitors and resistors may be formed. The fabrication technique, except for external connections to the pads made at the perimeter of the MMIC component, is throughout a photolithographic process controlled by large scale masks which may be generated by computer aided methods and which lend themselves to an automated mode of fabrication.

The word "monolithic" in the term "MMIC" implies the use of a single crystal, insulating, semi-insulating or semiconductor substrate upon which passive and active circuit elements may be fabricated and interconnected in accordance with one of several competing semiconductor technologies. At higher frequencies, the substrate material currently preferred for its semiconducting properties is gallium arsenide which has a high carrier (electron) mobility. In addition, gallium arsenide classified as a semi-insulator is available with the high bulk resistivity required to support low loss transmission lines and low loss conductive paths and required to provide good isolation between components. Gallium arsenide has a high dielectric instant (13.0) which is a factor, not always beneficial, influencing the transmission path design.

The word "microwave" in the term "MMIC" generally expresses the frequencies at which integrated circuits incorporating this technology are functional. Commonly the word implies circuit functionality at frequencies of 300 megahertz to 300,000 megahertz (Webster's New World Dictionary, p. 898). While some definitions may recognize no upper limit (e.g. "from about 1000 megahertz upwards" IEEE Standard Dictionary of Electronic and Electrical Terms, 3rd Edition, 1984), the word is also used to imply suitability for applications at much lower operating frequencies where high frequency response (at microwave frequencies) can improve circuit performance.

Functionality of an integrated circuit over the "microwave" portion of the radio frequency spectrum requires both good transistors in the active regions of the substrate as well as good passive devices and good point to point connections in the passive regions. In respect to the latter, the microwave transmission paths should be of reasonable efficiency and the conductive runs should be of low loss and good crossover techniques essential to any general circuit strategy such as "air bridges" should be present.

The term "integrated circuit" in the term "MMIC" implies that circuit components are formed integrally with the substrate by the photolithographic techniques discussed earlier, and that the circuit comprises pluralities of interconnected components, at least some of which are active.

MMIC technology is to be distinguished from "hybrid" monolithic integrated circuit technology. The dimensions of MMIC components, whether passive or active, are orders of magnitude smaller than lumped discrete components characteristic of the "hybrid" monolithic integrated circuit technology. In hybrid MIC technology, IC chips, transistor chips, capacitors, and resistors, etc. are treated as discrete components to be interconnected by wire bonds or similar non photolithographic techniques. Wire bond interconnections pose both the problem of creating electrical discontinuities at high frequencies by unwanted parasitic reactances and of introducing a variability in electrical characterization not present in a photolithographically defined interconnection technique.

The smaller dimensions characteristic of MMIC technology often reduces the phase delays in conductive paths and transmission lines to near negligibility. For instance, a differential signal path length of 200 microns, reasonable for the devices herein described, corresponds to a phase aberration of less than 2° at 10 gigahertz, where 10° would be tolerable. The smaller sizes and shorter distances between components characteristic of MMIC technology also reduce the parasitic capacitances and inductances within the active devices and in the interconnections between passive and active devices. These factors permit operation at frequencies as high as C-band (5-6 gigahertz) and often beyond with little difficulty.

Finally, both passive and active components can be matched with precision more economically with MMIC technology than with discrete technology. Large area metallizations, such as are used for capacitor plates or high current transmission lines are of course, highly accurate in an absolute sense. While absolute values may be somewhat more variable in small area devices, "tracking" or "matching" is often present. The symmetry attributable to common design rules in computer assisted layouts used in forming comparable devices contributes to this high degree of matching. In addition, the technology, which uses methods such as mask defined conductor runs and air bridges provides accuracy in conductor layouts with a repeatability which is not present in any other process.

In practical terms, MMIC technology has made possible the fabrication of the scaler herein described which is functional at frequencies as high as 5 gigahertz. In the embodiment of the scaler illustrated in FIG. 6, multiple active MESFET segments cooperate as parts of a unitary active MESFET with accurately formed resistive and capacitive elements and with efficient signal paths in close association with the MESFET to achieve a high frequency performance that cannot be matched by the discrete MIC technology.

While the monolithically integrated active MESFET herein described has particular advantage at very high frequencies, it is inherently a broadband device capable of working from DC to the very high microwave regions. At low frequencies, the segmented MESFET exhibits high input and output impedances due to low device capacitances and a very low feedback capacitance. This permits the device to be used at lower frequencies for high precision applications because of its low circuit loading and low internal feedback. For example, at lower frequencies attenuators having up to 60 db of attenuation or five bit phase shifters with less than five degrees of phase error can be built using MMIC technology.

What is claimed is:

1. A monolithically integrated active MESFET exhibiting an accurate small signal transfer, adjustable in selected discrete steps, comprising A. an input terminal for application of an input signal,
   B. an output terminal for derivation of an output signal and application of drain potentials,
   C. a source terminal for application of source potentials,
   D. an (m+n) fold plurality of terminals for application of transconductance control potentials,
   E. a dual gate MESFET, subdivided into a first n-fold quantity of selectively activated MESFET segments, each segment having a predetermined width to achieve a desired transconductance for relatively larger steps in signal transfer and including
      (1) an electroded source region connected to said source terminal,
      (2) an electroded drain region connected to said output terminal, and
      (3) a gate region defined between said source and drain regions having
         (i) a signal gate electrode disposed between said source and an activating gate electrode electrically connected to said input terminal for modifying the output signal current of said MESFET as a function of the transconductance of the segment, and
         (ii) an activating gate electrode disposed between said signal gate and said drain for turning current flow "ON" and "OFF" in said MESFET segment, and electrically connected to one of said (m+n) fold plurality of transconductance control terminals,
   F. said dual gate MESFET being further subdivided into a second, m-fold quantity of selectively activated MESFET segments, each segment having a predetermined width to achieve a desired transconductance for relatively smaller steps in signal transfer, and including
      (1) an electroded source region connected to said source terminal,
      (2) an electroded drain region connected to said output terminal, and
      (3) a gate region defined beween said source and drain regions having
         (i) a signal gate electrode, disposed between said source and an activating gate electrode, for modifying the output signal current of said MESFET as a function of the transconductance of the segment, and
         (ii) an activating gate electrode disposed between said signal gate and said drain for turning current flow "ON" and "OFF" in said MESFET segment, and electrically connected to one of said (m+n) fold plurality transconductance control terminals, and G. voltage division means electrically connected between said input terminal and said m-fold signal gate electrodes to apply a reduced signal voltage thereto so that wider segments may be used while a proportionately smaller equivalent transconductance is provided,
   said (m+n) fold MESFET segment transconductances being weighted and ordered for converting to an electrical control signal coupled to said (m+n) fold control terminals such that successive combinations of active segments provide a desired series of transfer values.

2. The monolithically integrated MESFET set forth in claim 1 wherein
   said voltage division means is a pair of resistances formed on said substrate by a photolithographic process.

* * * * *